(12) United States Patent
Yeh et al.

(10) Patent No.: US 9,450,094 B1
(45) Date of Patent: Sep. 20, 2016

(54) SEMICONDUCTOR PROCESS AND FIN-SHAPED FIELD EFFECT TRANSISTOR

(71) Applicant: UNITED MICROELECTRONICS CORP., Hsin-Chu (TW)

(72) Inventors: Chih-Chieh Yeh, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/848,305

(22) Filed: Sep. 8, 2015

(51) Int. Cl.
*H01L 29/06* (2006.01)
*H01L 29/78* (2006.01)
*H01L 29/66* (2006.01)
*H01L 29/08* (2006.01)
*H01L 29/267* (2006.01)

(52) U.S. Cl.
CPC ....... *H01L 29/7848* (2013.01); *H01L 29/0653* (2013.01); *H01L 29/0847* (2013.01); *H01L 29/267* (2013.01); *H01L 29/66795* (2013.01); *H01L 29/7851* (2013.01)

(58) Field of Classification Search
CPC ........... H01L 29/66795; H01L 29/785; H01L 29/7853; H01L 21/823821; H01L 21/845; H01L 27/0924; H01L 29/165; H01L 29/7848
See application file for complete search history.

(56) References Cited

U.S. PATENT DOCUMENTS

| | | |
|---|---|---|
| 2011/0210393 A1 | 9/2011 | Chen |
| 2014/0203338 A1 | 7/2014 | Kelly |
| 2014/0264604 A1 | 9/2014 | Tsai |
| 2015/0145067 A1* | 5/2015 | Liao ............ H01L 29/7848 257/401 |
| 2016/0042963 A1* | 2/2016 | Kim ............ H01L 21/0262 438/507 |

* cited by examiner

*Primary Examiner* — Roy Potter
*Assistant Examiner* — Paul Patton
(74) *Attorney, Agent, or Firm* — Winston Hsu; Scott Margo

(57) ABSTRACT

A semiconductor process includes the following steps. A fin on a substrate is provided. Spacers are formed only on sidewalls of the fin, where a top surface of the fin is higher than or equal to top surfaces of the spacers. An epitaxial structure is formed on the fin. The present invention also provides a fin-shaped field effect transistor including a fin, spacers and an epitaxial structure. The fin is located on a substrate. The spacers are disposed only on sidewalls of the fin, where a top surface of the fin is higher than or equal to top surfaces of the spacers. The epitaxial structure is disposed on the fin.

18 Claims, 4 Drawing Sheets

SEMICONDUCTOR PROCESS AND FIN-SHAPED FIELD EFFECT TRANSISTOR

BACKGROUND OF THE INVENTION

1. Field of the Invention

The present invention relates generally to a semiconductor process and a fin-shaped field effect transistor, and more specifically to a semiconductor process and a fin-shaped field effect transistor applying spacers to confine epitaxial structures growth.

2. Description of the Prior Art

For decades, chip manufacturers have been making metal-oxide-semiconductor (MOS) transistors faster by making them smaller. As semiconductor processes advance to very deep sub-micron era such as 65-nm node or beyond, how to increase the driving current for MOS transistors has become a critical issue. In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel. Attempts have been made to use a strained silicon layer, which has been grown epitaxially on a silicon substrate with a silicon germanium (SiGe) epitaxial structure or a silicon carbide (SiC) epitaxial structure disposed in between. In this type of MOS transistor, a biaxial compressive or tensile strain occurs in the epitaxy silicon layer due to the silicon germanium or silicon carbide which has a larger or smaller lattice constant than silicon; as a result, the band structure alters, and the carrier mobility increases. This enhances the speed performance of the MOS transistors.

Moreover, with increasing miniaturization of semiconductor devices, various multi-gate MOSFET such as fin-field effect transistor devices have been developed. The multi-gate MOSFET is advantageous for the following reasons. First, manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

Due to the aforesaid advantages of the epitaxy technology and the multi-gate MOSFET, attempts have been made in the industry to integrate the epitaxy technology to the multi-gate MOSFET for having the aforesaid advantages of both.

SUMMARY OF THE INVENTION

The present invention provides a semiconductor process and a fin-shaped field effect transistor, which forms spacers beside a fin to confine an epitaxial structure on the fin.

The present invention provides a semiconductor process including the following steps. A fin on a substrate is provided. Spacers are formed only on sidewalls of the fin, wherein a top surface of the fin is higher than or equal to top surfaces of the spacers. An epitaxial structure is formed on the fin.

The present invention provides a fin-shaped field effect transistor including a fin, spacers and an epitaxial structure. The fin is located on a substrate. The spacers are disposed only on sidewalls of the fin, wherein a top surface of the fin is higher than or equal to top surfaces of the spacers. The epitaxial structure is disposed on the fin.

According to the above, the present invention provides a semiconductor process and a fin-shaped field effect transistor, which forms a fin on a substrate, forms spacers only on sidewalls of the fin, wherein a top surface of the fin is higher than or equal to top surfaces of the spacers, and then forms an epitaxial structure on the fin. By doing this, the epitaxial structure can be raised by the spacers, and the volume, the shape and the location of the epitaxial structure can be controlled by the height and the shape of the spacer. Hence, the present invention reduces capacitance and increases operating speed, especially in a high frequency switching mode.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
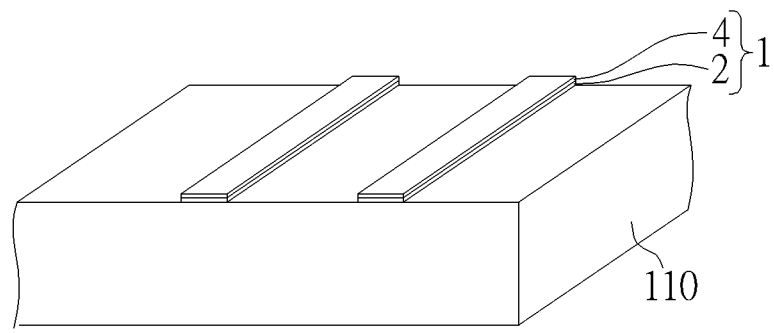
FIGS. 1-8 schematically depict three-dimensional diagrams of a semiconductor process according to an embodiment of the present invention.

FIGS. 1-8 schematically depict three-dimensional diagrams of a semiconductor process according to an embodiment of the present invention. As shown in FIG. 1, a substrate 110 is provided, wherein the substrate 110 is a silicon substrate in this embodiment for example. In other embodiments, the substrate 110 may be a semiconductor substrate such as a silicon containing substrate, a III-V group-on-silicon (such as GaN-on-silicon) substrate, a graphene-on-silicon substrate, a silicon-on-insulator (SOI) substrate or a substrate containing epitaxial layers. A mask layer (not shown) is formed on the substrate 110, wherein the mask layer includes a pad oxide layer (not shown) and a pad nitride layer (not shown) located on the pad oxide layer. The mask layer is patterned by methods such as a photolithography process for forming a mask 1, which constitutes by a patterned pad oxide layer 2 and a patterned pad nitride layer 4 and exposes a part of the substrate 110, but it is not limited thereto. In other cases, the mask layer may be composed of other materials different from the material of the substrate 110 for serving as a hard mask in later transferring processes.

Figure 2:
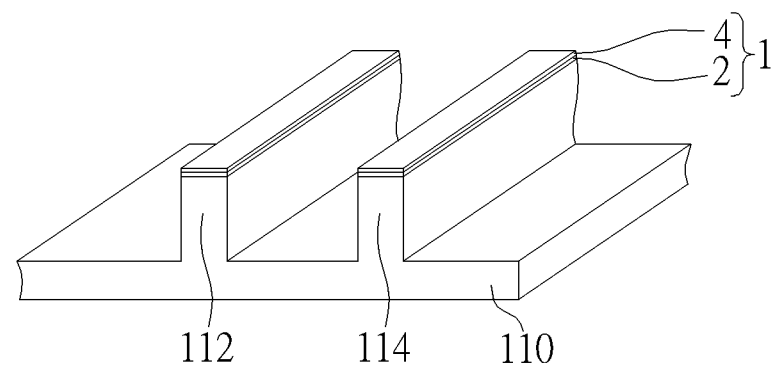

As shown in FIG. 2, the patterns of the patterned pad oxide layer 2 and the patterned pad nitride layer 4 are transferred into the substrate 110, and two fins 112 and 114 are therefore formed. In this embodiment, the patterned pad oxide layer 2 and the patterned pad nitride layer 4 are then removed for forming a tri-gate MOSFET. In another embodiment, the patterned pad oxide layer 122 and the patterned pad nitride layer 124 may remain for forming a double-gate fin field-effect transistor. In this embodiment, the substrate 110 is a silicon substrate, so that the fins 112 and 114 are silicon fins. In addition, the fins 112 and 114 may be silicon fins containing pentavalent atoms, silicon fins containing trivalent atoms, or others, which may be formed by doping atoms into the fins 112 and 114 or/and the substrate 110.

In this embodiment, the substrate 110 is a silicon substrate, but the present invention can also be applied in other semiconductor substrates, such as a silicon-on-insulator substrate. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fins formed on the silicon-on-insulator substrate (not shown) is finished.

For clarifying the present invention, two fins 112 and 114 are depicted in this embodiment, but the present invention can also be applied to one or more than two fins 112 and 114.

Figure 3:
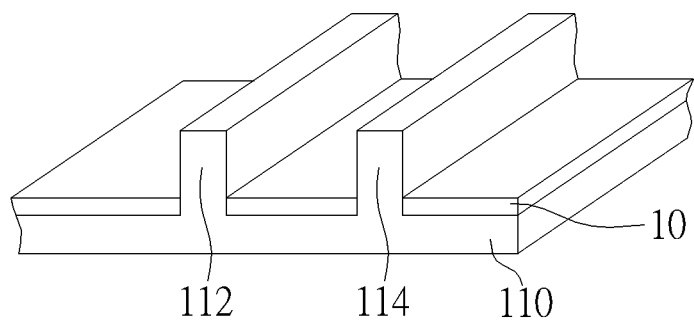

As shown in FIG. 3, an isolation structure 10, such as an oxide layer, is formed between the fins 112 and 114 by performing processes such as a depositing process and an etching back process. In one case, the isolation structure 10 may be a shallow trench isolation (STI) structure, which may be formed by a shallow trench isolation (STI) process, but it is not restricted thereto.

Figure 4:
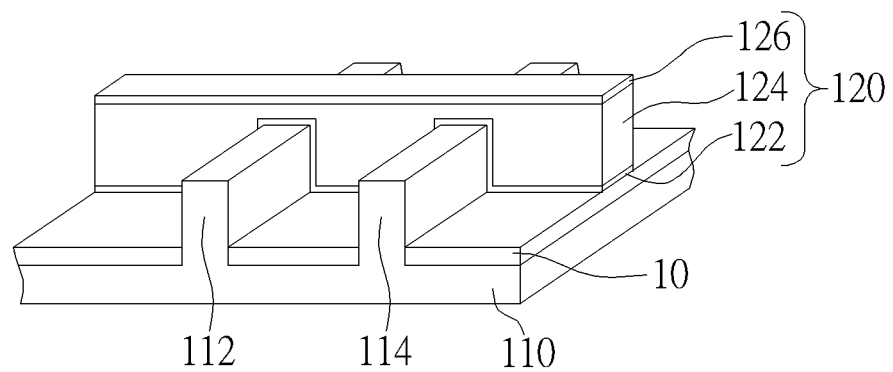

As shown in FIG. 4, a gate 120 is formed on a part of the isolation structure 10 and a part of the fins 112 and 114. The forming process of the gate 120 may include sequential depositing and patterning to form a gate dielectric layer 122 on a part of the isolation structure 10 and a part of the fins 112 and 114, a gate electrode 124 on the gate dielectric layer 122, and a cap layer 126 on the gate electrode 124. The present invention may be applied in a polysilicon gate process, a gate-first process, a gate-last for high-k first process, or a gate-last for high-k last process, depending upon practical requirements. The forming methods of these materials are known in the art, and are not described herein.

For instance, as a gate-last for high-k first process is applied in this embodiment, the gate dielectric layer 122 is a gate dielectric layer having a high dielectric constant, which may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_1\text{-}xO_3$, PZT) and barium strontium titanate ($Ba_xSr_1\text{-}xTiO_3$, BST), but it is not limited thereto. A buffer layer (not shown) may optionally be formed between the gate dielectric layer 122 and the substrate 110 to buffer the gate dielectric layer 122 and the substrate 110. A barrier layer (not shown) may be formed on the gate dielectric layer 122 to prevent above disposed metals from diffusing downwards to the gate dielectric layer 122 and from polluting the gate dielectric layer 122. The buffer layer may be an oxide layer formed by a thermal oxide process, a chemical oxide process, or others; the barrier layer may be a single layer structure or a multilayer structure composed of tantalum nitride (TaN) or titanium nitride (TiN) etc. In addition, as a gate-last for high-k last process is applied, the gate dielectric layer 122 will be removed in later processes and then a gate dielectric layer having a high dielectric constant is formed. Therefore, the material of the gate dielectric layer 122 may be just a sacrificial material suitable for being removed in later processes. The sacrificial electrode 124 may be made of polysilicon, which may be replaced by a metal electrode in a later replacement metal gate (RMG) process, but it is not limited thereto. The cap layer 126 may be a single layer, a multilayer composed of a nitride layer, an oxide layer, etc. used for being a patterned hard mask, but it is not limited thereto.

Figure 5:
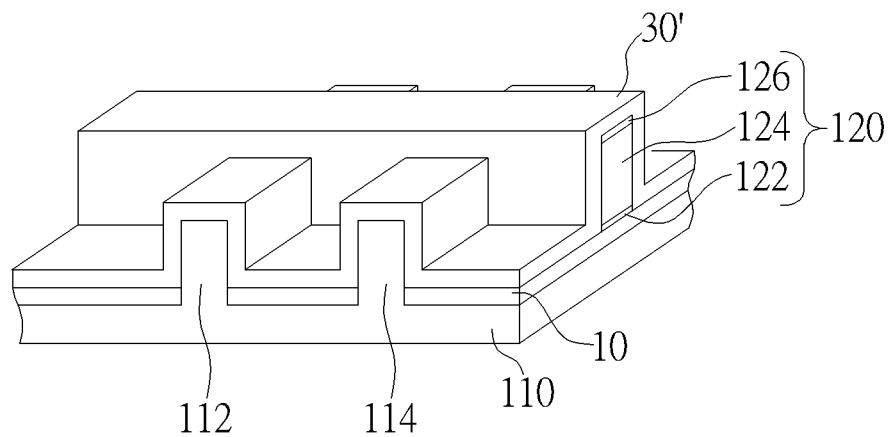
Figure 6:
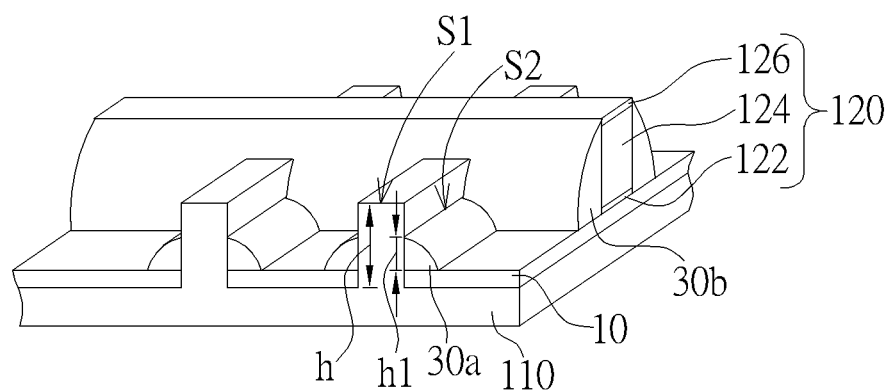

As shown in FIGS. 5-6, spacers 30a and 30b are formed on sidewalls of the fins 112 and 114 and sidewalls of the gate 120. More precisely, as shown in FIG. 5, a spacer material 30' may blanketly cover the fins 112 and 114, the isolation structure 10 and the substrate 110. Then, the spacer material 30' is etched to form the spacers 30a and 30b and expose the fins 112 and 114, wherein a part of the substrate 110 beside the fins 112 and 114 is not covered by the spacers 30a and 30b, as shown in FIG. 6. In this embodiment, the spacers 30a and 30b are formed on sidewalls of the fins 112 and 114 and sidewalls of the gate 120 at the same time by one single process, but it is not limited thereto. In another embodiment, the spacers 30a on sidewalls of the fins 112 and 114 and the spacers 30b on sidewalls of the gate 120 may be formed by different processes. In a preferred embodiment, the spacers 30a and 30b are formed by a dry etching process, but it is not limited thereto. In this embodiment, the spacers 30a and 30b may be nitride spacers, but it is not restricted thereto. The spacers 30a and 30b may be oxide spacers or others.

It is emphasized that, top surfaces S1 of the fins 112 and 114 are higher than or equal to top surfaces S2 of the spacers 30a for raising later formed epitaxial structures on the fins 112 and 114 and controlling volumes and shapes of the later formed epitaxial structures. In this case, the fins 112 and 114 protrude from the spacers 30a, and the top surfaces S1 of the fins 112 and 114 are higher than the top surfaces S2 of the spacers 30a. In a preferred embodiment, heights h1 of the spacers 30a are one-third to three-fourths of heights h of the fins 112 and 114. Preferably, the spacers 30a have D-shapes for the growth of the formed epitaxial structures.

Figure 7:
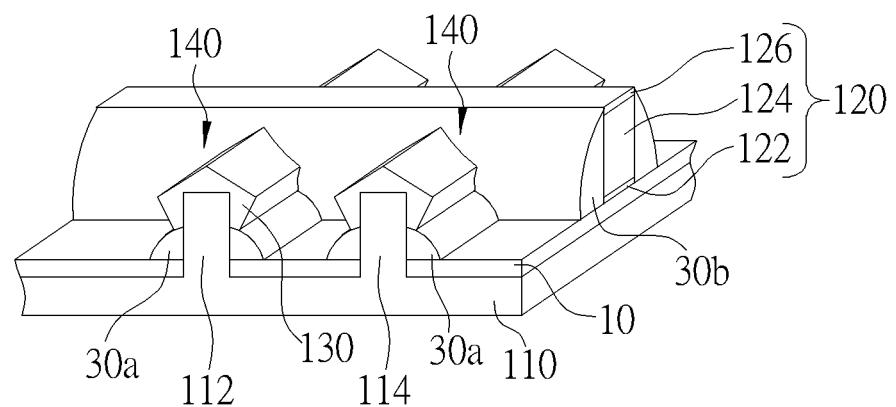

As shown in FIG. 7, epitaxial structures 130 are formed on the fins 112 and 114. It is noted that, the epitaxial structures 130 are formed right after the spacers 30a are formed without etching the fins 112 and 114 or processing other processes. As the fins 112 and 114 protrude from the spacers 30a, the epitaxial structures 130 contact a portion of the sidewalls of the fins 112 and 114 as well as the spacers 30a. In this way, the epitaxial structures 130 can be confined by the spacers 30a. That is, the volume, the shape and the location of the epitaxial structures 130 can be confined and adjusted by the height and the shape of the spacers 30a. In a high frequency switching mode, the present invention can reduce capacitance and increase operating speed.

In this embodiment, the epitaxial structures 130 are silicon phosphorous epitaxial structures for forming N-type MOS transistors, but it is not limited thereto. The epitaxial structures 130 may be silicon germanium epitaxial structures or others for forming p-type MOS transistors, or may be silicon carbide epitaxial structures or others for forming N-type MOS transistors.

Moreover, in this embodiment, the epitaxial structures 130 are formed after the gate 120, so that the epitaxial structures 130 are only beside the gate 120. Additionally, the epitaxial structures 130 may be formed before the gate 120, so that the epitaxial structures 130 cannot only be located beside the gate 120, but also right below the gate 120.

Thereafter, source/drains 140 may be formed in the fins 112 and 114 and the epitaxial structures 130 beside the gate 120. The source/drains 140 may doped with trivalent atoms or pentavalent atoms, according to the conductive type of a formed transistor. In this case, the source/drains 140 are formed after the epitaxial structures 130 are formed. In other cases, the source/drains 140 may be formed before the epitaxial structures 130 are formed for directly doping in the fins 112 and 114. Furthermore, the source/drains 140 may be formed by self-aligning the spacers 30b, or the source/drains 140 may be formed by self-aligning other spacers formed before the source/drains 140 are formed with or without the spacers 30b being removed. Metal silicide (not shown) may be formed on the source/drains 140 by methods such as a salicide process.

Figure 8:
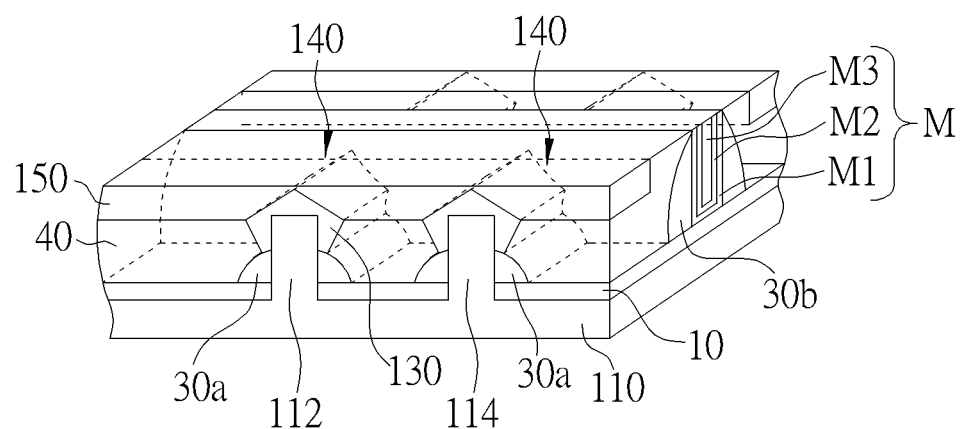

As shown in FIG. 8, a dielectric layer (not shown) may blankety cover the gate 120, the epitaxial structures 130 and the substrate 110, and then is planarized until the gate 120 is exposed, thereby a dielectric layer 40 being formed. A replacement metal gate (RMG) process may be processed to replace the gate 120 and form a metal gate M, depending upon practical requirements. The metal gate M may include an optional buffer layer (not shown), a dielectric layer having a high dielectric constant M1, a bottom barrier layer (not shown), a work function metal layer M2, a top barrier layer (not shown) and a low resistivity material M3, but it is not limited thereto. The dielectric layer having a high dielectric constant M1 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The bottom barrier layer and the top barrier layer may be composed of tantalum nitride (TaN) or titanium nitride (TiN) etc. The work function metal layer M2 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN), etc. The low resistivity material M3 may be composed of aluminum, tungsten, titanium aluminum (TiAl) alloy, cobalt tungsten phosphide (CoWP), etc.

Then, slot contacts 150 may be formed in the dielectric layer 40 by etching the dielectric layer 40 and filling metals in the dielectric layer 40, so that the slot contacts 150 can directly contact these epitaxial structures 130. The slot contacts 150 may be composed of a barrier layer (not shown) surrounding a low resistivity material (not shown), wherein the barrier layer may be composed of titanium (Ti), titanium nitride (TiN) or others, and the low resistivity material may be composed of tungsten or others. In this embodiment, one single slot contact 150 directly contacts these epitaxial structures 130 at the same side of the gate 120, but it is not limited thereto. Additionally, contact plugs (not shown) instead of the slot contact 150 may be formed in the dielectric layer 40 to contact each of the epitaxial structures 130 respectively.

To summarize, the present invention provides a semiconductor process and a fin-shaped field effect transistor, which forms a fin on a substrate, forms spacers only on sidewalls of the fin, wherein a top surface of the fin is higher than or equal to top surfaces of the spacers, and then forms an epitaxial structure on the fin. Since the top surface of the fin is higher than or equal to the top surfaces of the spacers, the epitaxial structure not only contacts a portion of the sidewalls of the fin but also contacts the spacers. Preferably, the spacers have D-shapes. Still preferably, heights of the spacers are one-third to three-fourths of a height of the fin. Hence, the epitaxial structure can be raised by the spacers, and the volume, the shape and the location of the epitaxial structure can be controlled by the height and the shape of the spacer. Thereby, the present invention can reduce capacitance and increase operating speed, especially in a high frequency switching mode.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a fin on a substrate; and
   forming spacers only on sidewalls of the fin, wherein a top surface of the fin is higher than or equal to top surfaces of the spacers, and a part of the substrate beside the fin is not covered by the spacers while the spacers are formed and the fin is exposed; and
   forming an epitaxial structure on the fin.

2. The semiconductor process according to claim 1, wherein the spacers comprise nitride spacers.

3. The semiconductor process according to claim 1, wherein the spacers have D-shapes.

4. The semiconductor process according to claim 3, wherein the epitaxial structure contacts the spacers and a portion of the sidewalls of the fin.

5. The semiconductor process according to claim 1, wherein heights of the spacers are one-third to three-fourths of a height of the fin.

6. The semiconductor process according to claim 1, wherein the step of forming the spacers comprises:
   blankety covering a spacer material on the fin and the substrate; and
   etching the spacer material to form the spacers and expose the fin.

7. The semiconductor process according to claim 1, wherein the epitaxial structure is formed right after the spacers are formed.

8. The semiconductor process according to claim 1, further comprising:
   forming a source/drain in the fin and the epitaxial structure after the epitaxial structure is formed.

9. The semiconductor process according to claim 1, further comprising:
   forming a source/drain in the fin before the epitaxial structure is formed.

10. A fin-shaped field effect transistor, comprising:
    a fin located on a substrate;
    spacers disposed only on sidewalls of the fin, wherein a top surface of the fin is higher than or equal to top surfaces of the spacers, and a part of the substrate beside the fin is not covered by the spacers; and
    an epitaxial structure disposed on the fin.

11. The fin-shaped field effect transistor according to claim 10, wherein the fin comprises a silicon fin, a silicon fin containing pentavalent atoms, or a silicon fin containing trivalent atoms.

12. The fin-shaped field effect transistor according to claim 10, wherein the spacers comprise nitride spacers.

13. The fin-shaped field effect transistor according to claim 10, wherein the spacers have D-shapes.

14. The fin-shaped field effect transistor according to claim 13, wherein the epitaxial structure contacts the spacers and a portion of the sidewalls of the fin.

15. The fin-shaped field effect transistor according to claim 10, wherein heights of the spacers are one-third to three-fourths of a height of the fin.

16. The fin-shaped field effect transistor according to claim 10, wherein the epitaxial structure comprises a silicon phosphorous epitaxial structure.

17. The fin-shaped field effect transistor according to claim 10, further comprising:
   a source/drain disposed in the fin and the epitaxial structure, isolation structures disposed on the substrate beside the fin and below the spacers, and a gate disposed over the fin and the substrate, and the spacers beside the gate.

18. The fin-shaped field effect transistor according to claim 10, wherein the fin-shaped field effect transistor comprises a plurality of said fins on the substrate, epitaxial structures on the fins, and a slot contact directly contacting these epitaxial structures.

* * * * *